US010203392B2

(12) United States Patent
Zhu et al.

(10) Patent No.: US 10,203,392 B2
(45) Date of Patent: Feb. 12, 2019

(54) DYNAMIC 3D MRI DATA SAMPLING

(71) Applicant: UNIVERSITY OF SOUTHERN CALIFORNIA, Los Angeles, CA (US)

(72) Inventors: Yinghua Zhu, Fremont, CA (US); Yi Guo, Los Angeles, CA (US); Krishna S. Nayak, Long Beach, CA (US); Robert Marc Lebel, Calgary (CA)

(73) Assignee: UNIVERSITY OF SOUTHERN CALIFORNIA, Los Angeles, CA (US)

( * ) Notice: Subject to any disclaimer, the term of this patent is extended or adjusted under 35 U.S.C. 154(b) by 206 days.

(21) Appl. No.: 15/075,716

(22) Filed: Mar. 21, 2016

(65) Prior Publication Data
US 2016/0274201 A1 Sep. 22, 2016

Related U.S. Application Data

(60) Provisional application No. 62/136,169, filed on Mar. 20, 2015.

(51) Int. Cl.
*G01R 33/48* (2006.01)
*G01R 33/563* (2006.01)

(52) U.S. Cl.
CPC ..... *G01R 33/5635* (2013.01); *G01R 33/4826* (2013.01); *G01R 33/56325* (2013.01)

(58) Field of Classification Search
None
See application file for complete search history.

(56) References Cited

U.S. PATENT DOCUMENTS

| | | | |
|---|---|---|---|
| 2009/0302840 A1* | 12/2009 | Fung | G01R 33/4818 324/309 |
| 2011/0234222 A1* | 9/2011 | Frahm | G01R 33/4824 324/309 |
| 2015/0187073 A1* | 7/2015 | Stemmer | G06T 5/001 382/131 |

(Continued)

OTHER PUBLICATIONS

Doneva, M. et al. 2011. Improving Scan Efficiency of Respiratory Gated Imaging Using Compressed Sensing with 3D Cartesian Golden Angle Sampling. Proceedings of the International Society of Magnetic Resonance Medicine, vol. 19, p. 641.

(Continued)

*Primary Examiner* — Paresh H Patel
(74) *Attorney, Agent, or Firm* — Brooks Kushman P.C.

(57) ABSTRACT

A magnetic resonance imaging system may include: a magnet; gradient coils; an RF pulse transmitter; an RF receiver that receives MR signals from tissue that has been exposed to RF pulses from the RF pulse generator, gradient fields from the gradient coils, and a magnetic field from the magnet; a system controller that controls the magnet, gradient coils, RF pulse transmitter, and RF receiver so as to generate data representative of at least a portion of the composition of an object, including controlling the gradient coils and RF receiver so as to cause MRI data to be acquired that includes information about at least one attribute of the object at different points in time and that represents an incomplete sample of a portion of k-space that is a Fourier transform of the object; and a data processing system that generates one or more images of at least a portion of the object based on the MRI data.

18 Claims, 4 Drawing Sheets

(56) References Cited

U.S. PATENT DOCUMENTS

2016/0334488 A1* 11/2016 Bieri .................. G01R 33/4824

OTHER PUBLICATIONS

Du, J. 2009. Contrast-Enhanced MR Angiography Using Time Resolved Interleaved Projection Sampling with Three-Dimensional Cartesian Phase and Slice Encoding (TRIPPS). Magnetic Resonance in Medicine, vol. 61, No. 4, pp. 918-924, Apr. 2009.

Haider, C. R. et al. 2008. 3D High Temporal and Spatial Resolution Contrast-Enhanced MR Angiography of the Whole Brain. Magnetic Resonance in Medicine, vol. 60, No. 3, pp. 749-760, Sep. 2008.

Korosec, F. R. et al. Time-Resolved Contrast-Enhanced 3D MR Angiography. Magnetic Resonance in Medicine, vol. 36, No. 3, pp. 345-351, Sep. 1996.

Lebel, R. M. et al. 2014. Highly Accelerated Dynamic Contrast Enhanced Imaging. Magnetic Resonance in Medicine, vol. 71, No. 2, pp. 635-644.

Lim, R. P. et al. 2008. 3D Time-Resolved MR Angiography (MRA) of the Carotid Arteries with Time-Resolved Imaging with Stochastic Trajectories: Comparison with 3D Contrast-Enhanced Bolus-Chase MRA and 3D Time-of-Flight MRA. AJNR Americal Journal of Neuroradiology, vol. 29, No. 10, pp. 1847-1854, Nov. 2008.

Prieto, C. et al. 2010. 3D Undersampled Golden-Radial Phase Encoding for DCE-MRA Using Inherently Regularized Iterative SENSE. Magnetic Resonance in Medicine, vol. 64, No. 2, pp. 514-526, Aug. 2010.

Saranathan, M. et al. 2012. Differential Subsampling with Cartesian Ordering (DISCO): A High Spatia-Temporal Resolution Dixon Imaging Sequence for Multiphasic Contrast Enhanced Abdominal Imaging. Journal of Magnetic Resonance Imaging (JMRI), vol. 35, No. 6, pp. 1484-1492, Jun. 2012.

Wang, K. et al. 2011. Interleaved Variable Density Sampling with a Constrained Parallel Imaging Reconstruction for Dynamic Contrast-Enhanced MR Angiography. Magnetic Resonance in Medicine, vol. 66, No. 2, pp. 428-436, Aug. 2011.

Winkelmann, S. et al. 2007. An Optimal Radial Profile Order Based on the Golden Ratio for Time-Resolved MRI. IEEE Trans. Med. Imaging, vol. 26, No. 1, pp. 68-76, Jan. 2007.

* cited by examiner

DYNAMIC 3D MRI DATA SAMPLING

CROSS-REFERENCE TO RELATED APPLICATION

This application claims the benefit of U.S. provisional application Ser. No. 62/136,169 filed Mar. 20, 2015, the disclosure of which is incorporated in its entirety by reference herein.

STATEMENT REGARDING FEDERALLY SPONSORED RESEARCH

This invention was made with Government support under a grant awarded by the National Center for Advancing Translational Sciences of the National Institutes of Health under Award Number UL1TR000130. The Government has certain rights in the invention.

BACKGROUND

Technical Field

This disclosure relates to magnetic resonance imaging (MRI) data sampling methods. More specifically, this disclosure relates to dynamic three-dimensional (3D) contrast-enhanced MR angiography (CE-MRA) and dynamic contrast enhanced (DCE) MRI, including approaches for increasing compatibility with advanced reconstruction algorithms.

Description of Related Art

MRI system can create external magnetic fields. These fields may be able to interact with polarized atoms in an object and generate images from detected induced currents from on-resonance polarized atoms.

CE-MRA and DCE-MRI are two dynamic applications of MRI that can image contrast enhanced signal variations during the time course of contrast agent passing through. They can utilize similar enhancement mechanisms, but can have different goals. CE-MRA can focus on vascular signals where contrast agent concentrations are very high and high spatiotemporal resolution can be critical. DCE-MRI, on the other hand, can focus on tissue signals, where contrast agent concentrations can be lower and change more slowly, and such changes can allow pharmacokinetics to be quantified.

Various sampling and reconstruction techniques have been proposed to address and improve the spatial versus temporal resolution trade-off in CE-MRA and DCE-MRI. Early view-sharing methods, such as keyhole [J. J. van Vaals, M. E. Brummer, W. T. Dixon, H. H. Tuithof, H. Engels, R. C. Nelson, B. M. Gerety, J. L. Chezmar, and J. A. den Boer, "'Keyhole' method for accelerating imaging of contrast agent uptake," J. Magn. Reson. Imaging JMRI, vol. 3, no. 4, pp. 671-675, August 1993] and time-resolved imaging of contrast kinetics (TRICKS) [F. R. Korosec, R. Frayne, T. M. Grist, and C. A. Mistretta, "Time-resolved contrast-enhanced 3D MR angiography," Magn. Reson. Med., vol. 36, no. 3, pp. 345-351, September 1996], filled the missing data from adjacent time frames. Since non-Cartesian sampling can be more robust to motion and efficient for dynamic imaging, TRICKS was extended to use radial projections [K. K. Vigen, D. C. Peters, T. M. Grist, W. F. Block, and C. A. Mistretta, "Undersampled projection-reconstruction imaging for time-resolved contrast-enhanced imaging," Magn. Reson. Med. Off. J. Soc. Magn. Reson. Med. Soc. Magn. Reson. Med., vol. 43, no. 2, pp. 170-176, February 2000] and spirals [J. Du and M. Bydder, "High-resolution time-resolved contrast-enhanced MR abdominal and pulmonary angiography using a spiral-TRICKS sequence," Magn. Reson. Med. Off. J. Soc. Magn. Reson. Med. Soc. Magn. Reson. Med., vol. 58, no. 3, pp. 631-635, September 2007]. Other non-Cartesian implementations include k-space weighted image contrast (KWIC) [H. K. Song and L. Dougherty, "Dynamic MRI with projection reconstruction and KWIC processing for simultaneous high spatial and temporal resolution," Magn. Reson. Med. Off. J. Soc. Magn. Reson. Med. Soc. Magn. Reson. Med., vol. 52, no. 4, pp. 815-824, October 2004], golden angle stack-of-stars [L. Feng, R. Grimm, K. T. Block, H. Chandarana, S. Kim, J. Xu, L. Axel, D. K. Sodickson, and R. Otazo, "Golden-angle radial sparse parallel MRI: combination of compressed sensing, parallel imaging, and golden-angle radial sampling for fast and flexible dynamic volumetric MRI," Magn. Reson. Med. Off. J. Soc. Magn. Reson. Med. Soc. Magn. Reson. Med., vol. 72, no. 3, pp. 707-717, September 2014], vastly undersampled isotropic projection reconstruction (VIPR) [A. V. Barger, W. F. Block, Y. Toropov, T. M. Grist, and C. A. Mistretta, "Time-resolved contrast-enhanced imaging with isotropic resolution and broad coverage using an undersampled 3D projection trajectory," Magn. Reson. Med. Off. J. Soc. Magn. Reson. Med. Soc. Magn. Reson. Med., vol. 48, no. 2, pp. 297-305, August 2002], highly constrained back projection (HYPR) [C. A. Mistretta, O. Wieben, J. Velikina, W. Block, J. Perry, Y. Wu, K. Johnson, and Y. Wu, "Highly constrained backprojection for time-resolved MRI," Magn. Reson. Med. Off. J. Soc. Magn. Reson. Med. Soc. Magn. Reson. Med., vol. 55, no. 1, pp. 30-40, January 2006], and stack-of-spirals [Y. F. Yen, K. F. Han, B. L. Daniel, S. Heiss, R. L. Birdwell, R. J. Herfkens, A. M. Sawyer-Glover, and G. H. Glover, "Dynamic breast MRI with spiral trajectories: 3D versus 2D," J. Magn. Reson. Imaging JMRI, vol. 11, no. 4, pp. 351-359, April 2000].

Performance of non-Cartesian sequences can be limited by gradient errors and off-resonance artifacts. For this reason, investigators have reverted to Cartesian sequences where the phase encode (PE) order provides variable density, much like non-Cartesian approaches. Such sequences can include Cartesian projection reconstruction (CAPR) [C. R. Haider, H. H. Hu, N. G. Campeau, J. Huston 3rd, and S. J. Riederer, "3D high temporal and spatial resolution contrast-enhanced MR angiography of the whole brain," Magn. Reson. Med. Off. J. Soc. Magn. Reson. Med. Soc. Magn. Reson. Med., vol. 60, no. 3, pp. 749-760, September 2008], stochastic trajectories (TWIST) [R. P. Lim, M. Shapiro, E. Y. Wang, M. Law, J. S. Babb, L. E. Rueff, J. S. Jacob, S. Kim, R. H. Carson, T. P. Mulholland, G. Laub, and E. M. Hecht, "3D time-resolved MR angiography (MRA) of the carotid arteries with time-resolved imaging with stochastic trajectories: comparison with 3D contrast-enhanced Bolus-Chase MRA and 3D time-of-flight MRA," AJNR Am. J. Neuroradiol., vol. 29, no. 10, pp. 1847-1854, November 2008], interleaved variable density (IVD) [K. Wang, R. F. Busse, J. H. Holmes, P. J. Beatty, J. H. Brittain, C. J. Francois, S. B. Reeder, J. Du, and F. R. Korosec, "Interleaved variable density sampling with a constrained parallel imaging reconstruction for dynamic contrast-enhanced MR angiography," Magn. Reson. Med. Off. J. Soc. Magn. Reson. Med. Soc. Magn. Reson. Med., vol. 66, no. 2, pp. 428-436, August 2011], a multi-level radial profile ordering [M. Akgakaya, T. A. Basha, R. H. Chan, H. Rayatzadeh, K. V. Kissinger, B. Goddu, L. A. Goepfert, W. J. Manning, and R. Nezafat, "Accelerated contrast-enhanced whole-heart coronary MRI using low-dimensional-structure self-learning and thresholding," Magn. Reson. Med. Off. J. Soc. Magn. Reson. Med.

Soc. Magn. Reson. Med., vol. 67, no. 5, pp. 1434-1443, May 2012], differential subsampling with Cartesian ordering (DISCO) [M. Saranathan, D. W. Rettmann, B. A. Hargreaves, S. E. Clarke, and S. S. Vasanawala, "Differential Subsampling with Cartesian Ordering (DISCO): a high spatio-temporal resolution Dixon imaging sequence for multiphasic contrast enhanced abdominal imaging," *J. Magn. Reson. Imaging JMRI*, vol. 35, no. 6, pp. 1484-1492, June 2012], variable-density Poisson ellipsoid [R. M. Lebel, J. Jones, J.-C. Ferre, M. Law, and K. S. Nayak, "Highly accelerated dynamic contrast enhanced imaging," *Magn. Reson. Med. Off. J. Soc. Magn. Reson. Med. Soc. Magn. Reson. Med.*, vol. 71, no. 2, pp. 635-644, 2014], and an ordering that gradually improves spatial resolution [N. Gdaniec, H. Eggers, P. Bornert, M. Doneva, and A. Mertins, "Robust abdominal imaging with incomplete breath-holds," *Magn. Reson. Med. Off. J. Soc. Magn. Reson. Med. Soc. Magn. Reson. Med.*, vol. 71, no. 5, pp. 1733-1742, May 2014].

Cartesian and non-Cartesian sequences have also been combined, starting with Time resolved interleaved projection sampling with 3D Cartesian Phase and Slice encoding (TRIPPS) [J. Du, "Contrast-enhanced MR angiography using time resolved interleaved projection sampling with three-dimensional Cartesian phase and slice encoding (TRIPPS)," *Magn. Reson. Med. Off. J. Soc. Magn. Reson. Med. Soc. Magn. Reson. Med.*, vol. 61, no. 4, pp. 918-924, April 2009] that applied rasterized radials on the PE plane, and golden angle radial phase encoding (Golden-RPE) [C. Prieto, S. Uribe, R. Razavi, D. Atkinson, and T. Schaeffter, "3D undersampled golden-radial phase encoding for DCE-MRA using inherently regularized iterative SENSE," *Magn. Reson. Med. Off. J. Soc. Magn. Reson. Med. Soc. Magn. Reson. Med.*, vol. 64, no. 2, pp. 514-526, August 2010] that combined radial sampling and Cartesian readouts. TRIPPS and Golden-RPE were succeeded by golden angle (GA) variants [M. Doneva, C. Stehning, K. Nehrke, and P. Börnert, "Improving Scan Efficiency of Respiratory Gated Imaging Using Compressed Sensing with 3D Cartesian Golden Angle Sampling," *ISMRM*, p. 641, 2011], variable-density radial (VDRad) [J. Y. Cheng, M. Uecker, M. T. Alley, S. S. Vasanawala, J. M. Pauly, and M. Lustig, "Free-Breathing Pediatric Imaging with Nonrigid Motion Correction and Parallel Imaging," *ISMRM*, p. 312, 2013], and golden angle spiral variants [C. Prieto, M. Doneva, M. Usman, M. Henningsson, G. Greil, T. Schaeffter, and R. M. Botnar, "Highly efficient respiratory motion compensated free-breathing coronary mra using golden-step Cartesian acquisition," *J. Magn. Reson. Imaging JMRI*, February 2014].

Most of the aforementioned methods accelerate time-resolved MRI by undersampling in k-space, and use parallel imaging [K. P. Pruessmann, M. Weiger, M. B. Scheidegger, and P. Boesiger, "SENSE: sensitivity encoding for fast MRI," *Magn. Reson. Med. Off. J. Soc. Magn. Reson. Med. Soc. Magn. Reson. Med.*, vol. 42, no. 5, pp. 952-962, November 1999], [M. A. Griswold, P. M. Jakob, R. M. Heidemann, M. Nittka, V. Jellus, J. Wang, B. Kiefer, and A. Haase, "Generalized autocalibrating partially parallel acquisitions (GRAPPA)," *Magn. Reson. Med. Off. J. Soc. Magn. Reson. Med. Soc. Magn. Reson. Med.*, vol. 47, no. 6, pp. 1202-1210, June 2002] and/or compressed sensing [M. Lustig, D. Donoho, and J. M. Pauly, "Sparse MRI: The application of compressed sensing for rapid MR imaging," *Magn. Reson. Med. Off. J. Soc. Magn. Reson. Med. Soc. Magn. Reson. Med.*, vol. 58, no. 6, pp. 1182-1195, December 2007] for reconstruction. Poisson disc sampling [K. S. Nayak and D. G. Nishimura, "Randomized Trajectories for Reduced Aliasing Artifact," *ISMRM*, p. 670, 1998] has been a choice for undersampling since compressed sensing was introduced to MRI [M. Lustig, D. Donoho, and J. M. Pauly, "Sparse MRI: The application of compressed sensing for rapid MR imaging," *Magn. Reson. Med. Off. J. Soc. Magn. Reson. Med. Soc. Magn. Reson. Med.*, vol. 58, no. 6, pp. 1182-1195, December 2007]. Numerous algorithms have been proposed to efficiently generate Poisson disc sampling patterns, including dart throwing [M. A. Z. Dippé and E. H. Wold, "Antialiasing Through Stochastic Sampling," in *Proceedings of the 12th Annual Conference on Computer Graphics and Interactive Techniques*, New York, N.Y., USA, 1985, pp. 69-78], jittered sampling [R. L. Cook, "Stochastic Sampling in Computer Graphics," *ACM Trans Graph*, vol. 5, no. 1, pp. 51-72, January 1986], best candidate [D. P. Mitchell, "Spectrally Optimal Sampling for Distribution Ray Tracing," in *Proceedings of the 18th Annual Conference on Computer Graphics and Interactive Techniques*, New York, N.Y., USA, 1991, pp. 157-164], and more recent O(N) boundary sampling [D. Dunbar and G. Humphreys, "A Spatial Data Structure for Fast Poisson-disk Sample Generation," in *ACM SIGGRAPH* 2006 *Papers*, New York, N.Y., USA, 2006, pp. 503-508] and modified dart throwing [R. Bridson, "Fast Poisson Disk Sampling in Arbitrary Dimensions," in *ACM SIGGRAPH* 2007 *Sketches*, New York, N.Y., USA, 2007].

Lebel et al. [R. M. Lebel, J. Jones, J.-C. Ferre, M. Law, and K. S. Nayak, "Highly accelerated dynamic contrast enhanced imaging," *Magn. Reson. Med. Off. J. Soc. Magn. Reson. Med. Soc. Magn. Reson. Med.*, vol. 71, no. 2, pp. 635-644, 2014] proposed Poisson ellipsoid sampling based on dart-throwing for dynamic imaging by extending the 2D Poisson disc pattern to 3D $k_y$-$k_z$-t space. This method can provide excellent transform sparsity, can be compatible with parallel imaging, and can limit temporal redundancy. Unfortunately, it can be computationally intensive, have many input variables, and be poorly suited to variable temporal resolution.

In contrast, golden angle Cartesian sampling [M. Doneva, C. Stehning, K. Nehrke, and P. Börnert, "Improving Scan Efficiency of Respiratory Gated Imaging Using Compressed Sensing with 3D Cartesian Golden Angle Sampling," *ISMRM*, p. 641, 2011] can provide more coherent sampling than the Poisson ellipsoid approach. Yet, it can allow flexibility in the specification of temporal resolution during reconstruction and fast on-line generation of the PE order. Here PD is denoted to variable density Poisson ellipsoid sampling and GA is denoted to Cartesian golden angle radial sampling.

Previous approaches may not effectively produce sampling patterns that satisfy all of the following properties: efficient, robust to gradient errors and off-resonance artifacts, excellent transform sparsity, compatible with parallel imaging, flexible in the specification of temporal resolution during reconstruction, and fast on-line generation.

SUMMARY

A magnetic resonance imaging system may include: a magnet; gradient coils; an RF pulse transmitter; an RF receiver that receives MR signals from tissue that has been exposed to RF pulses from the RF pulse generator, gradient fields from the gradient coils, and a magnetic field from the magnet; a system controller that controls the magnet, gradient coils, RF pulse transmitter, and RF receiver so as to generate data representative of at least a portion of the composition of an object, including controlling the gradient coils and RF receiver so as to cause MRI data to be acquired that includes information about at least one attribute of the object at different points in time and that represents an incomplete sample of a portion of k-space that is a Fourier transform of the object; and a data processing system that generates one or more images of at least a portion of the object based on the MRI data.

The system controller may cause an acquisition of k-space that is processed by the data processing system and, when so processed, may produce incoherent artifacts in the one or more images. The incoherent artifacts may be produced when a portion of the object is moving or changing.

The data processing system may choose a temporal or spatial resolution of the one or more images during or after the k-space data is acquired.

The system controller may cause the k-space to be acquired along radial spokes, on a Cartesian grid, or at only a portion of the locations along each radial spoke.

The k-space may have a center and periphery. The system controller may cause the k-space to be acquired at locations near the k-space center more frequently than locations near the k-space periphery.

The system controller may cause the k-space to be acquired from the k-space periphery to the k-space center.

The system controller may cause the k-space to be acquired at locations identified by a random or pseudorandom number generator.

A non-transitory, tangible, computer-readable storage media may contain a program of instructions that, when loaded in an MRI system of any of the types recited above in this section, cause the system controller and data processing system of the MRI system to perform any of the functions that are recited above in this section.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Figure 1:
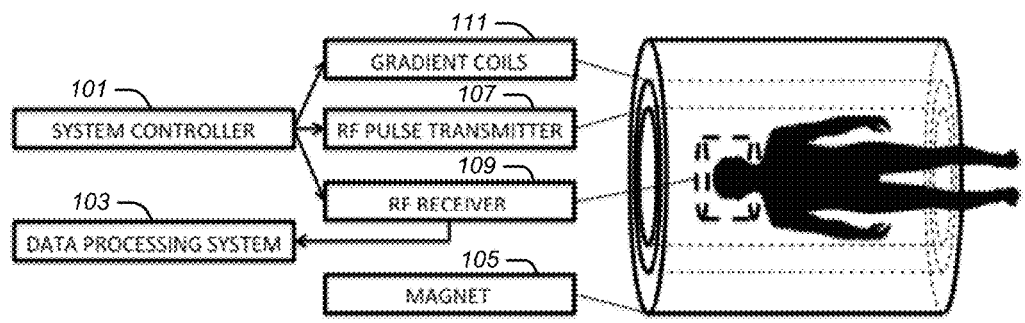
FIG. 1 is an example of components in an MRI system.

FIG. 1 is an example of components in an MRI system. As illustrated in FIG. 1, an MRI system may include scanner hardware, a system controller 101, and a data processing system 103. The scanner hardware may include a magnet 105 that may polarize atoms and may provide resonance conditions, an RF pulse transmitter 107 that may excite signals from polarized atoms, an RF receiver 109 that may receive signals from atoms, and gradient coils 111 that may spatially encode atom resonance. The system controller 101 may take orders from one or more inputs and may control the scanner hardware to excite and acquire MRI signals from an object in accordance with one or more of the approaches described below. The data processing system 103 may receive signals and reconstruct images based on MRI data that is acquired as a consequence.

Algorithm

A continuous data acquisition scheme may be implemented by modifying a standard 3D Cartesian spoiled gradient echo sequence. Full Cartesian sampling may be used along the standard frequency encoding direction kx. PE sampling in the ky-kz plane may be freely sub-sampled and/or reordered. This proposed method is termed GOlden-angle CArtesian Randomized Time-resolved (GOCART) 3D MRI.

Poisson disc sampling may be suitable for combined parallel imaging and compressed sensing. Poisson ellipsoid [R. M. Lebel, J. Jones, J.-C. Ferre, M. Law, and K. S. Nayak, "Highly accelerated dynamic contrast enhanced imaging," *Magn. Reson. Med. Off. J. Soc. Magn. Reson. Med. Soc. Magn. Reson. Med.*, vol. 71, no. 2, pp. 635-644, 2014] may expand Poisson disc to ky-kz-t space with the constraint that samples do not coexist within an ellipsoid surrounding each sample. Variable density may be achieved by subdividing the ky-kz plane into a series of annuli with exponentially decreasing sampling density, and fully sampling central region with 15% of the total samples.

Golden angle (GA) sampling [S. Winkelmann, T. Schaeffter, T. Koehler, H. Eggers, and O. Doessel, "An optimal radial profile order based on the Golden Ratio for time-resolved MRI," *IEEE Trans. Med. Imaging*, vol. 26, no. 1, pp. 68-76, January 2007] may support flexible temporal resolution selection in reconstruction because it may provide approximately uniform angular sampling for an arbitrary number of spokes. 3D Cartesian GA implementation [M. Doneva, C. Stehning, K. Nehrke, and P. Börnert, "Improving Scan Efficiency of Respiratory Gated Imaging Using Compressed Sensing with 3D Cartesian Golden Angle Sampling," *ISMRM*, p. 641, 2011] may be applied in the ky-kz plane, where Cartesian PEs are selected in order to form a close approximation to golden angle radial spokes.

Based on the GA scheme, a probability of sampling (P) for each PE, a central k-space region where P always equals to 1, and a temporal window (W) within which the same PE is not repeated are introduced. Once a PE is chosen by a GA radial spoke going through it, the chance of acquisition may be determined by P (P∈(0, 1]), such that part of the PEs along the spoke may be skipped. Data may then be acquired from subsequent spokes by skipping some PEs in one spoke, and more incoherent and uniform sampling can be achieved.

PE skipping may be disabled (P=1) within a predefined central region because the center of k-space may be especially important for preserving low-frequency image information. Considering that each spoke starts from (or ends in) the center of k-space, the center may be naturally oversampled, and excessive k-space center sampling density may need to be avoided. The temporal window W may prevent frequently repeated PEs, and the window width may be defined as integer multiple of the TR. Finally, corners of the ky-kz plane may not be acquired.

Figure 2:
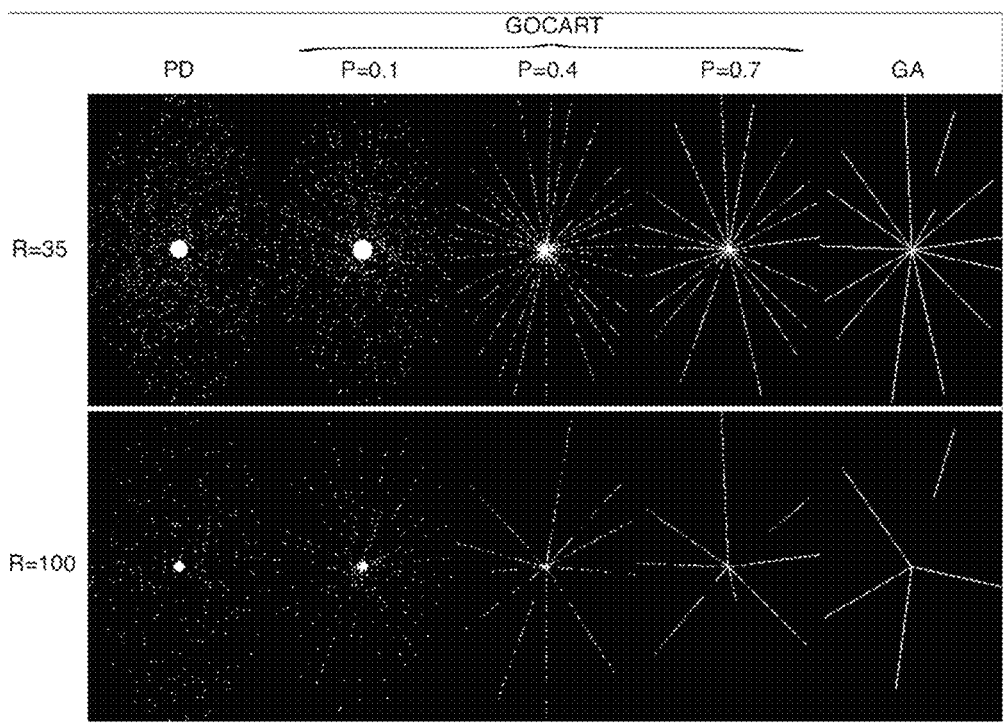
FIG. 2 is an example of a sampling pattern for single time frames for variable density Poisson ellipsoid sampling (PD), and what is described below as a GOlden-angle CArtesian Randomized Time-resolved (GOCART) 3D MRI with different sampling probabilities and reduction factors.

FIG. 2 is an example of a sampling pattern for single time frames for Poisson disc (PD) sampling, and GOCART 3D MRI with different sampling probabilities and reduction factors. FIG. 2 demonstrates the PEs for single time frames for PD and GOCART with P=0.1, 0.4, 0.7, and 1 (equivalent to the original GA). Data may be continually acquired and retrospectively binned into frames for reconstruction. Within each data frame, the first PE and the last PE may be in the middle of radial spokes, which may look like a discontinuity in the ky,kz plane (e.g. GA with R=35 in FIG. 2). Reduction factors (R) of 35× and 100× are presented for a matrix size of 256×150.

The P=1 central regions may account for approximately 15% of PEs at each undersampling, in accordance with the setting in PD. W was empirically set to 50% of the number of PEs per time frame with 100× acceleration to limit sampling redundancy. 35× was used in an experimental DCE setup, and 100× was the highest R in this study. As P decreases, more sampling randomization was achieved, and the central region had better coverage.

The sampling probability P may be a key feature of GOCART and analyzing image-space point spread functions (PSF) may provide an intuitive metric for optimizing this parameter. The aim may be to reduce coherent side lobes, which may be expected to improve compatibility with compressed sensing [M. Lustig, D. Donoho, and J. M. Pauly, "Sparse MRI: The application of compressed sensing for rapid MR imaging," *Magn. Reson. Med. Off. J. Soc. Magn. Reson. Med. Soc. Magn. Reson. Med.*, vol. 58, no. 6, pp. 1182-1195, December 2007]. The PD sampling tables were always generated separately for different temporal resolutions, while GA and GOCART sampling tables were retrospectively segmented from single generations, respectively. The PSFs were obtained by taking inverse Fourier transforms along the ky-kz dimensions. All the PSFs were normalized to the peaks, and displayed at the same linear scale.

Figure 3:
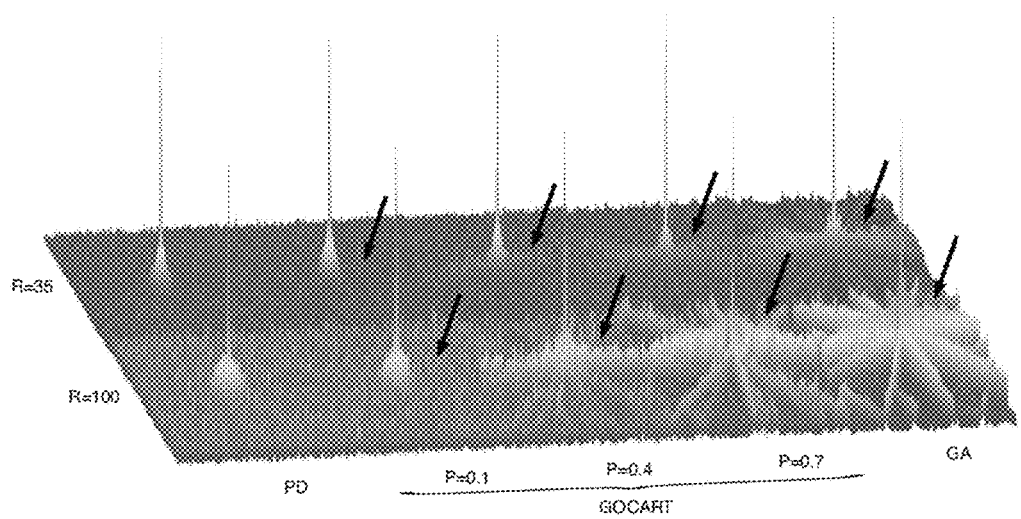
FIG. 3 is an example of a point spread function of GOCART as the probability of sampling (P) decreases from 1 to 0.1.

FIG. 3 is an example of a point spread function of GOCART as the probability of sampling (P) decreases from 1 to 0.1. FIG. 3 shows the PSFs of the sampling patterns in FIG. 2. In general, R=100 has higher side lobes than R=35. PD has the lowest amplitude lobes while GA (which is GOCART with P=1) has clearly visible coherent streaks. With GOCART, this coherent streaking may diminish as P decreases (arrows), essentially converging to PD as P approaches 0. All the PSFs were normalized to the peaks, and the minor visible peak differences are due to interpolation.

Figure 4:
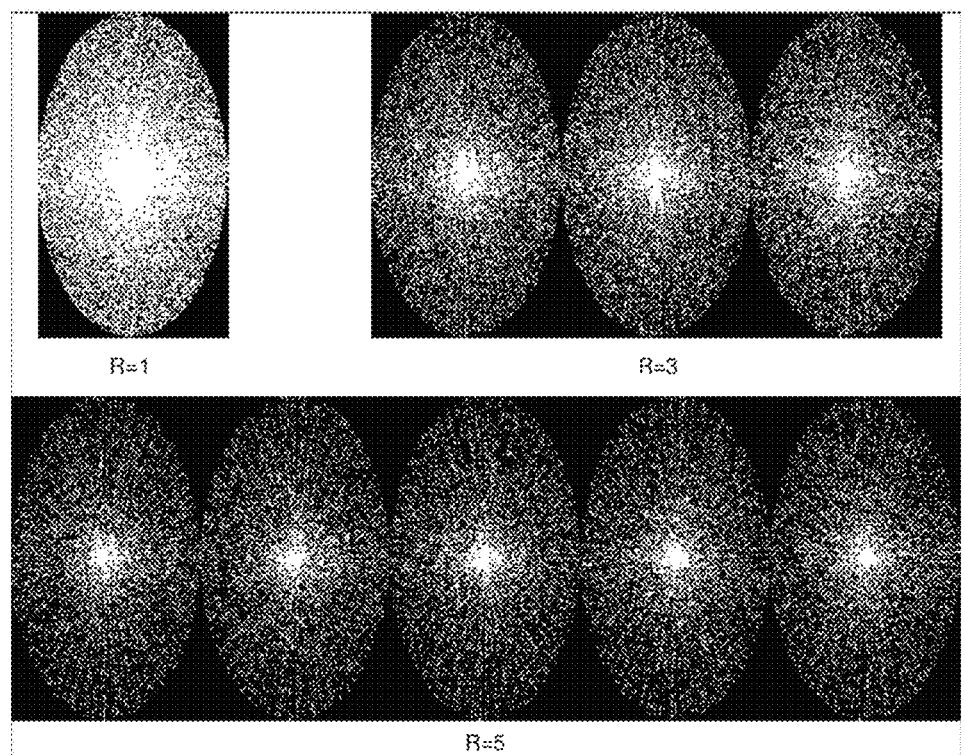
FIG. 4 is an example of reduction factor (R)=1 data being binned to R=3 and R=5 while maintaining relatively uniform k-space coverage.
Figure 5:
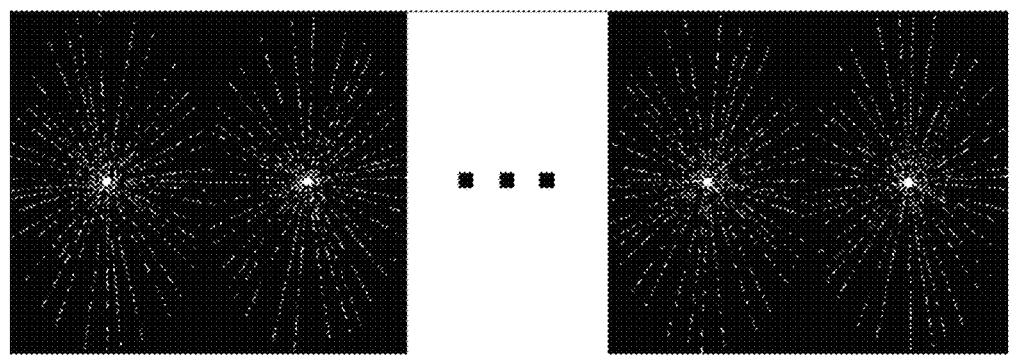
FIG. 5 is an example of R=1 data being binned to R=35 and R=100 while maintaining relatively uniform k-space coverage.
Figure 5:
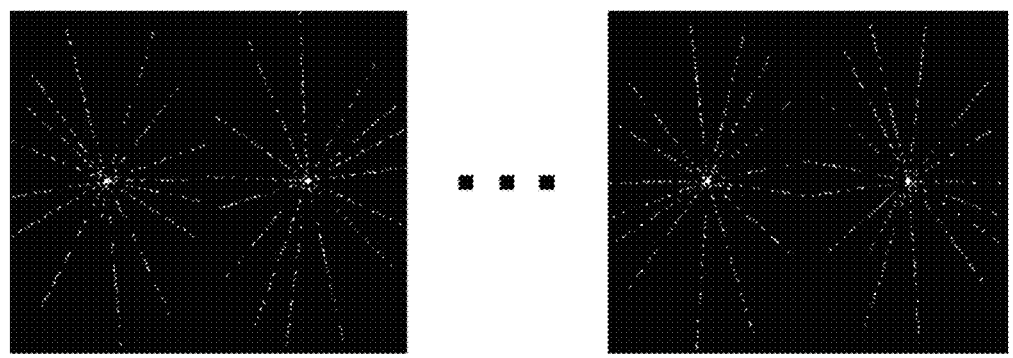

FIG. 4 is an example of reduction factor (R)=1 data being binned to R=3 and R=5 while maintaining relatively uniform k-space coverage. FIG. 5 is an example of R=1 data being binned to R=35 and R=100 while maintaining relatively uniform k-space coverage.

FIG. 4 and FIG. 5 illustrate the property of flexible selection of temporal resolution during image reconstruction. The acquired data can be retrospectively binned to different number of frames, achieving different R, while maintaining relatively uniform coverage within each frame. The matrix size was 256×150, and the P was 0.3. FIG. 4 shows the data with reduction factor (R)=1 are binned to R=3 and R=5, and FIG. 5 shows the same data are binned to R=35 and R=100.

Figure 6:
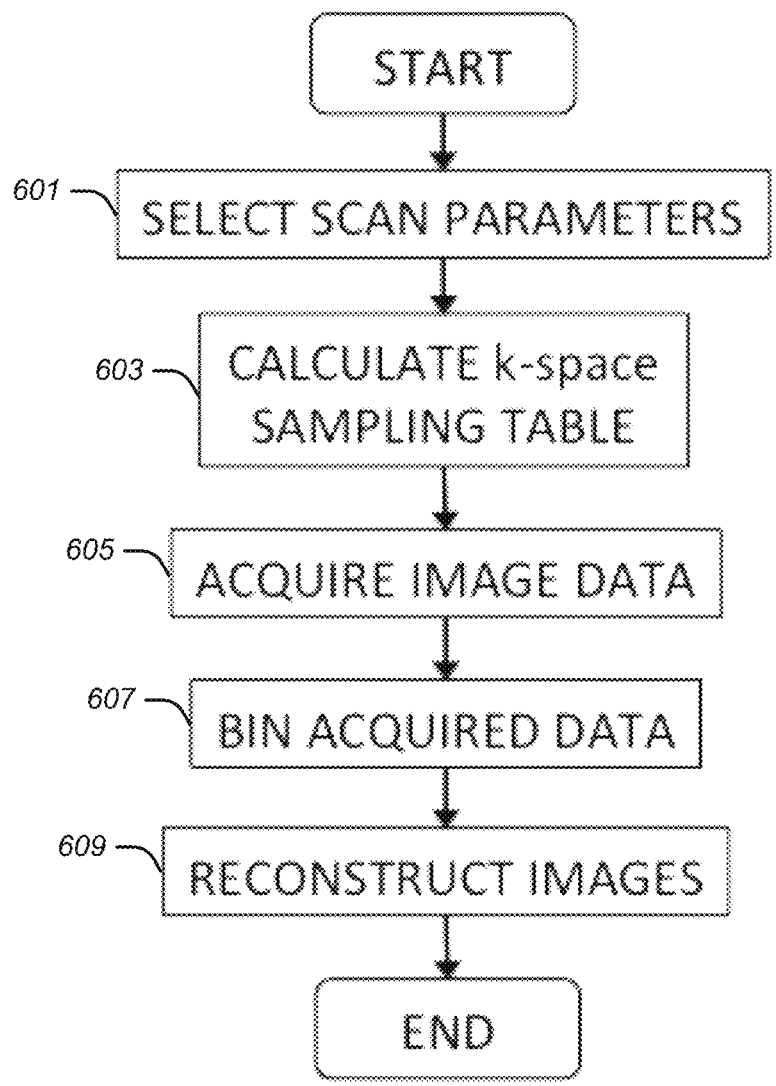
FIG. 6 is an example of process flow of a GOCART scan.

FIG. 6 is an example of process flow of a GOCART scan. A scan may begin by selecting the scan parameters during a Select Scan Parameters step 601, including the spatial coverage and resolution. The sampling table may then be calculated by the GOCART algorithm described above, as reflected in a Calculate k-space Sampling Table step 603, and loaded by the MRI scanner. This may be followed by data acquisition using GOCART sampling pattern, as reflected by an Acquire Image Data step 605. After the data acquisition, the data may be binned with desired temporal resolution, as reflected by a Bin Acquired Data step 607, and a reconstruction algorithm may be performed to retrieve the images of the object, as reflected by a Reconstruct Images step 609.

Possible Advantages

GOCART may provide one or more of the following advantages:

GOCART may allow fast, flexible, and reproducible case-dependent view-order generation. It required 0.097 sec for GOCART and 31 sec for PD to generate sampling patterns for a 10 min DCE scan on a single 2.5 GHz CPU. GOCART may therefore be suitable to real-time selection of imaging parameters such as the FOV and spatial resolution. With a suitable pseudo-random number generator, the sampling pattern may be readily re-generated during image reconstruction, which may eliminate storage and transfer of an external look-up table.

GOCART may maintain or improve reconstruction accuracy and temporal resolution relative to alternative methods. In no case did GOCART overly degrade reconstructed image quality and in some cases, specifically very high acceleration rates, outperformed PD and GA. These have been demonstrated in both retrospective in-vivo studies and phantom simulation studies.

As it is based on a radial acquisition, GOCART may have intrinsic variable density sampling. The underlying sampling density may be inversely proportional to kr, the radial distance to the k-space center. The center of k-space may have higher sampling density, which may be beneficial for sparse reconstruction [R. M. Lebel, J. Jones, J.-C. Ferre, M. Law, and K. S. Nayak, "Highly accelerated dynamic contrast enhanced imaging," *Magn. Reson. Med. Off. J. Soc. Magn. Reson. Med. Soc. Magn. Reson. Med.*, vol. 71, no. 2, pp. 635-644, 2014], [M. Lustig, D. Donoho, and J. M. Pauly, "Sparse MRI: The application of compressed sensing for rapid MR imaging," *Magn. Reson. Med. Off. J. Soc. Magn. Reson. Med. Soc. Magn. Reson. Med.*, vol. 58, no. 6, pp. 1182-1195, December 2007].

GOCART may inherit the flexible temporal resolution intrinsic to GA. The optimal temporal resolution for a dynamic MRI scan may be unknown a priori and may depend on the PK parameters of the tissue. The phantom simulation also suggested a variable temporal resolution reconstruction that assigns a higher temporal resolution to significantly changing signals. This may be possible with GOCART.

GOCART may be compatible with multi-level sampling patterns that leverage asymptotic structure in CS and are tailored to the object [B. Adcock, A. C. Hansen, C.

Poon, and B. Roman, "Breaking the coherence barrier: A new theory for compressed sensing," *ArXiv E-Prints*, vol. 1302, p. 561, February 2013]. Specifically, a kr-dependent sampling probability mask can be employed, instead of a uniform sampling probability.

The algorithm that has been described may be modified in various ways, including:

The number generators could be modified and extended to benefit different reconstruction methods.

The pseudorandom generators could be modified to extend the periods and improve randomness.

The perturbation angle could be adjusted to generate other randomized sampling patterns.

The temporal windows could be used to design sophisticated sampling patterns.

Other trajectories may include:

Modifications of the sampling order within a determined radial have the potential to reduce image artifacts from eddy current.

Variations of sampling pattern can be generated from non-radial MRI pulse sequences.

Other variations may include:

The proposed method may be combined with echo planar imaging (EPI) to improve sampling efficiency.

Automatic parameter selection for the sampling pattern generation and image reconstruction may simplify the scan process and yield the optimal combination of spatiotemporal resolution and image quality.

Unless otherwise indicated, the system controller and data processing system that have been discussed herein may each be implemented with one or more special purpose computer systems specifically configured to perform the functions that have been described herein for the component. Each computer system may include one or more processors, tangible memories (e.g., random access memories (RAMs), read-only memories (ROMs), and/or programmable read only memories (PROMS)), tangible storage devices (e.g., hard disk drives, CD/DVD drives, and/or flash memories), system buses, video processing components, network communication components, input/output ports, and/or user interface devices (e.g., keyboards, pointing devices, displays, microphones, sound reproduction systems, and/or touch screens).

Each computer system may include one or more computers at the same or different locations. When at different locations, the computers may be configured to communicate with one another through a wired and/or wireless network communication system.

Each computer system may include software (e.g., one or more operating systems, device drivers, application programs, and/or communication programs). When software is included, the software includes programming instructions and may include associated data and libraries. When included, the programming instructions are configured to implement one or more algorithms that implement one or more of the functions of the computer system, as recited herein. The description of each function that is performed by each computer system also constitutes a description of the algorithm(s) that performs that function.

The software may be stored on or in one or more non-transitory, tangible storage devices, such as one or more hard disk drives, CDs, DVDs, and/or flash memories. The software may be in source code and/or object code format. Associated data may be stored in any type of volatile and/or non-volatile memory. The software may be loaded into a non-transitory memory and executed by one or more processors.

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and/or advantages. These also include embodiments in which the components and/or steps are arranged and/or ordered differently.

For example, the approaches described above may be used in static applications or other dynamic applications besides CE-MRA and DCE-MRI. Also the sampling pattern can be generated from non-radial MRI pulse sequences.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element proceeded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

The invention claimed is:

1. A magnetic resonance imaging system comprising:
a magnet;
gradient coils;
an RF pulse transmitter;
an RF receiver that receives MR signals from tissue that has been exposed to RF pulses from the RF pulse transmitter, gradient fields from the gradient coils, and a magnetic field from the magnet;
a system controller that controls the magnet, gradient coils, RF pulse transmitter, and RF receiver so as to generate data representative of at least a portion of a composition of an object, including controlling the gradient coils and RF receiver so as to cause MRI data to be acquired that includes information about at least one attribute of the object at different points in time and that represents an incomplete sample of a portion of k-space that is a Fourier transform of the object, the MRI data being acquired by full Cartesian sampling along a frequency encoding direction kx with sub-sampled and/or reordered phase encoded sampling in a ky-kz plane wherein the system controller causes k-space data to be acquired along golden angle radial spokes in the ky-kz plane; and
a data processing system that generates one or more images of at least a portion of the object based on the MRI data.

2. The magnetic resonance imaging system of claim 1 wherein the system controller causes an acquisition of k-space that is processed by a data processing system and, when so processed, produces incoherent artifacts in the one or more images.

3. The magnetic resonance imaging system of claim 2 wherein the incoherent artifacts are produced when a portion of the object is moving or changing.

4. The magnetic resonance imaging system of claim 2 wherein the data processing system chooses a temporal or spatial resolution of the one or more images during or after k-space data is acquired.

5. The magnetic resonance imaging system of claim 1 wherein the system controller causes k-space data to be acquired on a Cartesian grid.

6. The magnetic resonance imaging system of claim 1 wherein the system controller causes k-space data to be acquired at only a portion of locations along each radial spoke.

7. The magnetic resonance imaging system of claim 6 wherein k-space has a center and periphery and the system controller causes k-space data to be acquired at locations near the k-space center more frequently than locations near the k-space periphery.

8. The magnetic resonance imaging system of claim 6 wherein the system controller causes k-space data to be acquired from the k-space periphery to the k-space center.

9. The magnetic resonance imaging system of claim 5 wherein the system controller causes k-space data to be acquired at locations identified by a random or pseudorandom number generator.

10. A non-transitory, tangible, computer-readable storage media containing a program of instructions that, when loaded in an MRI system of the type recited in claim 1, cause the system controller and data processing system of the MRI system to perform the functions that are recited in claim 1.

11. The storage media of claim 10 wherein the program of instructions cause the system controller to perform the functions that are recited in claim 2.

12. The storage media of claim 10 wherein the incoherent artifacts are produced when recited in claim 3.

13. The storage media of claim 10 wherein the program of instructions cause the data processing system to perform the functions that are recited in claim 4.

14. The storage media of claim 10 wherein the program of instructions cause the system controller to perform the functions that are recited in claim 5.

15. The storage media of claim 10 wherein the program of instructions cause the system controller to perform the functions that are recited in claim 6.

16. The storage media of claim 10 wherein the program of instructions cause the system controller to perform the functions that are recited in claim 7.

17. The storage media of claim 10 wherein the program of instructions cause the system controller to perform the functions that are recited in claim 8.

18. The storage media of claim 10 wherein the program of instructions cause the system controller to perform the functions that are recited in claim 9.

* * * * *

UNITED STATES PATENT AND TRADEMARK OFFICE
CERTIFICATE OF CORRECTION

PATENT NO. : 10,203,392 B2
APPLICATION NO. : 15/075716
DATED : February 12, 2019
INVENTOR(S) : Yinghua Zhu et al.

Page 1 of 1

It is certified that error appears in the above-identified patent and that said Letters Patent is hereby corrected as shown below:

In the Claims

Column 12, Line 16, Claim 9:
After "The magnetic resonance imaging system of claim"
Delete "5" and
Insert -- 1 --.

Signed and Sealed this
Second Day of July, 2019

Andrei Iancu
*Director of the United States Patent and Trademark Office*